United States Patent [19]

Dalal

[11] 4,253,882
[45] Mar. 3, 1981

[54] MULTIPLE GAP PHOTOVOLTAIC DEVICE

[75] Inventor: Vikram L. Dalal, Newark, Del.

[73] Assignee: University of Delaware, Newark, Del.

[21] Appl. No.: 121,802

[22] Filed: Feb. 15, 1980

[51] Int. Cl.$^3$ ............................................. H01L 31/04
[52] U.S. Cl. ..................................... 136/249; 136/258; 136/255; 357/2; 357/30; 427/74; 29/572
[58] Field of Search .......... 136/89 MS, 89 TF, 89 SJ, 136/89 CC; 357/2, 30; 427/74; 29/572

[56] References Cited

U.S. PATENT DOCUMENTS

| 3,973,994 | 8/1976 | Redfield | 136/89 |
| 4,133,698 | 1/1979 | Chiang et al. | 136/89 SJ |
| 4,135,950 | 1/1979 | Rittner | 136/89 SJ |

OTHER PUBLICATIONS

D. E. Carlson et al., "Amorphous Thin Films For Solar Cell Applications," *RCA Quarterly Report*, No. 3, Jul. 1979, SAN-2219-3, pp. 69-75.

Y. Marfaing, "Evaluation of Multijunction Structures Using Amorphous Si-Ge Alloys," Proceedings, 2nd European Community Photovoltaic Solar Energy Conf., Berlin, Apr. 1979, Reidel Pub. Co., (1979), pp. 287-294.

N. Tohge et al., "The Electrical & Photovoltaic Properties of Heterojunctions Between An Amorphous Ge--Te-Se Film & Crystalline Silicon," *Thin Solid Films*, vol. 56, pp. 377-382, (1979).

W. Fuhs et al., "Heterojunctions of Amorphous Silicon & Silicon Single Crystals," Int. Conf. Amorphous Semiconductors, IBM Watson Research Center, Yorktown Heights, N.Y., (1974), pp. 345-350.

Y. Hamakawa et al., "A New Type of Amorphous Silicon Photovoltaic Cell Generating More Than 2.0 V," *Appl. Phys. Lett.*, pp. 187-189, (1979).

L. M. Fraas et al., "Design of High Efficiency Monolithic Stacked Multijunction Solar Cells," *Conf. Record, 13th IEEE Photovoltaic Specialists Conf.*, (1978), pp. 886-891.

*Primary Examiner*—Aaron Weisstuch
*Attorney, Agent, or Firm*—Connolly and Hutz

[57] ABSTRACT

A multiple gap photovoltaic device having a transparent electrical contact adjacent a first cell which in turn is adjacent a second cell on an opaque electrical contact, includes utilizing an amorphous semiconductor as the first cell and a crystalline semiconductor as the second cell.

12 Claims, 3 Drawing Figures

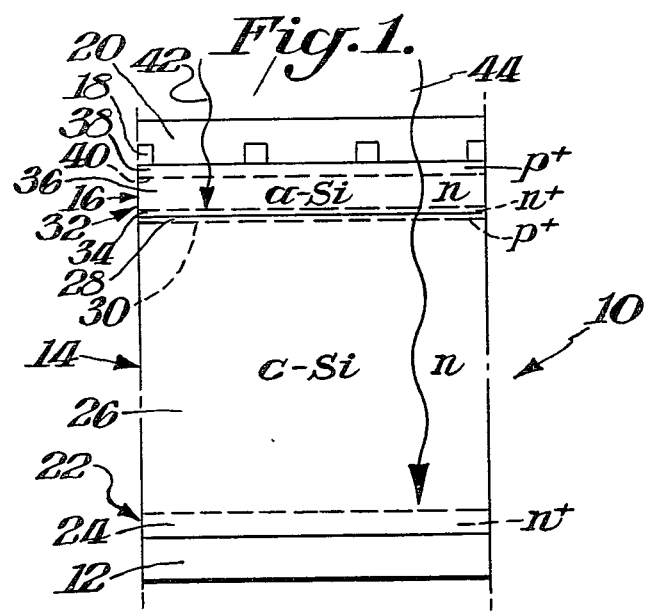
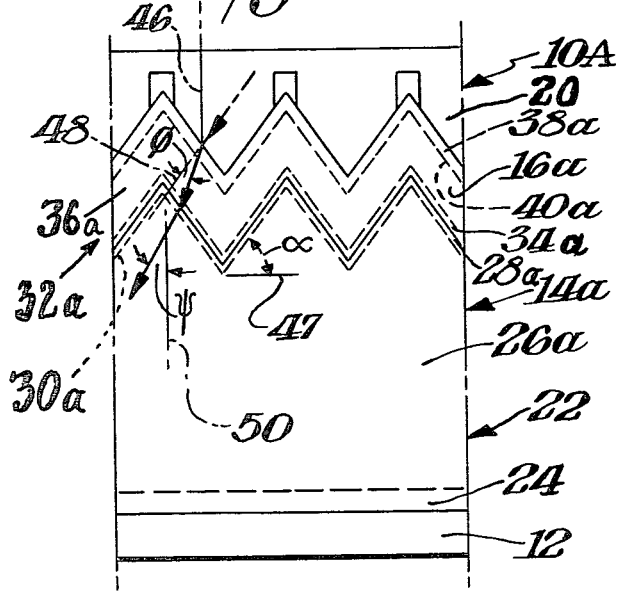
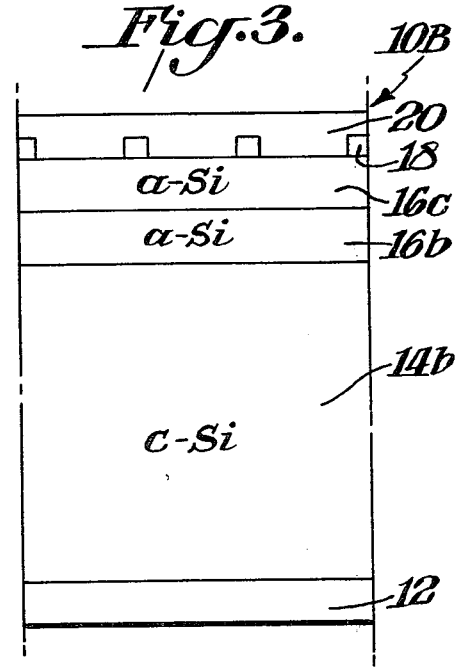

MULTIPLE GAP PHOTOVOLTAIC DEVICE

The Government has rights in this invention pursuant to Contract No. DE-AC-03-79-ET-23034 awarded by the U.S. Department of Energy.

CROSS-REFERENCE TO RELATED APPLICATION

This application is a continuation-in-part of application Ser. No. 80,194, filed Oct. 1, 1979, entitled "Amorphous Semiconductor Solar Cell", the details of which are incorporated herein by reference thereto.

BACKGROUND OF INVENTION

Solar cells or photovoltaic devices are well known and are made from various semiconductor materials. For example, approximately 18% efficiency of solar energy conversion has been achieved by using cyrstalline silicon (c-Si) material. Amorphous silicon (a-Si) is a new material which is being used for solar cell applications. The present efficiency of these cells, however, is rather low (6%). Despite this low efficiency, amorphous silicon is a particularly desirable semiconductor material for photovoltaic devices since a-Si has a band-gap (1.5–2.0 eV) in the range needed for high efficiency, is easy to deposit, has a high absorption coefficient whereby a thin film can absorb most of the light, and its electronic properties can be changed by doping with n and p type dopants.

A further approach taken heretofore in the photovoltaic art is to increase efficiency by using multiple gap devices which include, for example, plural cells between the transparent and opaque electrical contacts.

SUMMARY OF INVENTION

An object of this invention is to provide a photovoltaic device which utilizes an amorphous material, such as amorphous silicon, as a semiconductor with improved efficiency thereof.

A further object of this invention is to provide a method of manufacturing such device.

In accordance with this invention the photovoltaic device is a multiple gap device wherein the cell adjacent the opaque electrical contact is a crystalline semiconductor and the cell adjacent the transparent electrical contact is an amorphous semiconductor.

The efficiency of the multiple gap photovoltaic device may also be improved by texturing the surface of the crystalline semiconductor adjacent the amorphous semiconductor.

In accordance with a further ramification of this invention, a plurality of amorphous cells may be formed on the crystalline cell, with the amorphous cells decreasing in energy gap toward the crystalline cell. In a preferred practice of this invention, both the amorphous and the crystalline semiconductors are made from silicon alloys thereof.

THE DRAWINGS

FIG. 1 schematically illustrates in section (with the cross-hatching omitted for clarity) a multiple gap photovoltaic device in accordance with this invention;

FIG. 2 schematically illustrates in section a photovoltaic device in accordance with another aspect of this invention; and FIG. 3 schematically illustrates in section yet a further embodiment of this invention.

DETAILED DESCRIPTION

FIG. 1 illustrates a photovoltaic device 10 in accordance with this invention. As indicated therein photovoltaic device 10 includes a substrate 12 which functions an an opaque electrical contact upon which is deposited a crystalline solar cell 14. An amorphous solar cell 16 is then deposited thereon, and a transparent electrical contact 18 is then formed on cell 16. Substrate 12 may be of a conventional material such as a layer of zinc-plated copper foil or brass or molybdenum or silicon sheet, while electrical contact 18 similarly may be of gold, silver, nickel, aluminum or copper or may be of various metal alloys in grid form as is known in the art. If desired, an encapsulant 20, such as glass, may also be provided over contact 18.

Elements 14, 16 each comprises a semiconductor and, although each is not provided with its own electrical contacts, each element 14, 16 is referred to herein as a solar cell in that each semiconductor includes regions of different polarity, as well as an electrical junction.

With respect to crystalline solar cell 14, techniques are known for forming the solar cell on a substrate with, for example, a base layer 22 having a thin region 24 of $n^+$ polarity and a thicker region 26 of n polarity. Junction layer 28 is then formed with $p^+$ polarity and electrical junction 30 is located between junction layer 28 and region 26. It is, of course, to be understood that the particular polarities illustrated are merely exemplary and are not intended to be limiting.

Amorphous cell 16 is then formed on crystalline cell 14. Parent application Ser. No. 80,194 discloses a photovoltaic device utilizing an amorphous semiconductor wherein, by a heat treatment, the dopant species from the junction layer is diffused into the base layer to create a new electrical junction below the region of the former physical junction with the former physical junction thereby no longer existing. The parent application also discloses techniques whereby the use of different dopants results in regions of different conductivity type. The teachings of the parent application may also be utilized in the practice of this invention, and a detailed discussion of such techniques need not be repeated herein since the details of the parent application are incorporated herein by reference thereto. By such techniques, however, cell 16 includes a base layer 32 having a thin region of $n^+$ doping with a thicker region 36 of lightly doped n type conductivity and a junction region 38 of $p^+$ doping with electrical junction 40 therebetween.

In the preferred practice of this invention, solar cell 16, which may be considered a first cell, is made from amorphous silicon (a-Si) and a second solar cell 14 is made from crystalline silicon (c-Si). Other amorphous and crystalline materials, however, may also be used such as alloys of Si and such as Ge and its alloys.

The operation of photovoltaic device 10 will now be explained with respect to FIG. 1 wherein first cell 16 is a-Si and second cell 14 is c-Si.

The incoming photons first pass through a-Si cell 16. Those photons with energy $h\nu_1$ (arrow 42) greater than the bandgap of a-Si cell 16 are mostly absorbed in a-Si cell 16, generating a short-circuit current $J_{SC}{}^A$ in a-Si cell 16. The remaining photons pass through c-Si cell 14, where most of the photons with energy $h\nu_2$ (arrow 44) greater than the bandgap of c-Si cell 14 are absorbed. These photons generate a current $J_{SC}{}^B$ under short-circuit conditions. The open-circuit voltages generated in a-Si cell 16 is $V^A$ and in c-Si cell 14 is $V^B$. An n+p+ heterojunction tunnel diode comprised by layers 34 and 28 effects electrical interconnection between cells 14 and 16. When layers 28 and 34 are appropriately doped, negligible voltage is developed across the junction. Layers 28 and 34 would furthermore be made extremely thin in order to be transparent for the passage of light into c-Si cell 14. Typically, the fill factors (FF) in both a-Si cell 16 and c-Si cell 14 are approximately equal.

If the thickness of the two materials and the current collection efficiency are such that $J_{SC}^A \approx J_{SC}^B$ and negligible voltage develops across the junction between layers 28 and 34, then the two solar diodes, which are in series, produce a current of $J_{SC}$ and a voltage of $V^A+V^B$, and a fill factor of FF. [The tunnel junction composed of layers 28 and 34 (which comprise a solar cell of reversed polarity) additionally should introduce little or no opposing voltage (i.e., it must be electrically and optically "semi-transparent") or otherwise $V_{total} << V^A+V^B$.] Then, the total efficiency is given by $$\eta^T 32\ J_{SC} \cdot (V^A+V^B) \cdot FF$$

This invention is particularly useful when c-Si cell 14 is composed of polycrystalline grains, or of low quality Si material. In such cases, the current in c-Si cell 14 tends to be smaller than that of a high quality crystalline cell. In such case, the increase in voltage that results from using a-Si in combination with poly-c-Si can give a significantly larger efficiency than in poly-c-Si alone. Thus with the practice of the invention, photovoltaic device 10 can consist of a thick, relatively inexpensive, low quality c-Si, yet achieve increased efficiency by including thin a-Si cell 16. In this respect cell 14 may be ten times thicker than cell 16.

The following example illustrates the improved efficiency of photovoltaic device 10. In this example, region 24 is 0.2 μm thick, region 26 is 10 μm thick, junction layer 28 is 0.10 μm thick, region 34 is 0.05 μm thick, region 36 is 1 μm thick and juction layer 38 is 0.05 μm thick. Table I compares the efficiency of a-Si cell 16 alone, a c-Si cell 14 alone and the combination thereof. The calculations are based on 90 mW/cm² insolation using the methods of Rothwarf et al and Dalal as described in Proceedings of 11th IEEE Photovoltaic Specialists Conference, (Phoenix, Arizona 1975) and in Journal of Applied Physics, Vol. 48, 1244 (1977), respectively.

TABLE I

|  | a-Si Cell 16 alone | c-Si Cell 14 alone | a-Si:c-Si combination |
|---|---|---|---|
| $J_{SC}$ | 15.3 mA/cm² | 24 mA/cm² | 15.3 mA/cm² |
| FF | .75 | .75 | .75 |
| $V_{OC}$ | 1.0 V | .65 V | 1.63 V |
| $\eta$ | 12.7% | 13% | 18.7% |

As is apparent from Table I, the combination of the amorphous silicon cell with the crystalline silicon cell results in significantly higher efficiency than with either cell alone. Thus, the invention is particularly useful for increasing the efficiency of low quality Si solar cells (e.g. polycrystalline Si cells or Si cells made from low minority carrier lifetime Si material). Such a photovoltaic device is particularly advantageous because c-Si serves as a perfect host lattice for a-Si because of the match of thermal expansion coefficients and lattice constants.

FIG. 2 represents a further aspect of this invention. in FIG. 2 like reference numerals are used for like parts as in FIG. 1 with the suffix "a" used where corresponding parts differ. The device 10A of FIG. 2, however, embodies texturing the surface of c-Si cell 14a before depositing a-Si cell 16a whereby an increased photon absorption is obtained in both the a-Si cell 16a and the c-Si cell 14a. The deposited a-Si thin film cell 16a which includes junction layer 38a and base layer 32a having regions 36a and 34a follows the contours of the textured c-Si cell surface. Consequently the light rays 46 entering the a-Si cell 16a are bent by an angle which is related to the refractive index of a-Si and to the angle α of the textured surface with respect to the horizontal 47. For a typical c-Si texture angle α of ≈55°, the rays entering a-Si cell 16a are inclined at $\phi \approx 14°$ to a line 48 normal to the textured surface. Hence, the effective absorption constant increases by 1/cos $\phi$=3 to 4%. The angle $\phi$ can be increased by immersing the device in a transparent encapsulant 20 of refractive index $\eta_1$. For $\eta_1$=1.8, for example, $\phi \approx 25°$, and 1/cos $\phi \approx 1.1$, or an increase in effective absorption constant of 10%.

This increase in effective absorption constant results in carriers being generated nearer the junction 40a in base layer 32a of the a-Si cell 16a. Hence, the collection efficiency of the a-Si cell 16a increases, and hence, current in the a-Si cell 16a increases, as compared to an identical non-textured combination. Consequently, the efficiency of an a-Si/c-Si photovoltaic device will increase.

The light ray 46, after bending at the textured a-Si cell surface, continues into the c-Si cell 14a. Again, because of the bending, the photons are absorbed nearer to the junction region in the c-Si cel 14a. For $\phi$=25°, the angle $\psi$ by which light rays are bent with respect to the vertical 50 normal in the c-Si cell 14a is $\psi \approx 30°$. This results in an apparent increase of 1/cos $\psi \approx 15\%$ in absorption constant in the c-Si cell base layer 26a. Thus, texturing of the c-Si cell surface, before depositing the a-Si cell 16a, results in improved current collection in both a-Si cell 16a and c-Si cell 14a.

Texturing also results in light-trapping and hence lower bent surface reflection. This is similar to the reduction of reflection observed in c-Si cells with textured surfaces.

As illustrated in FIG. 2 to achieve the desired texturing, junction 30a is textured whereby the outer surface or physical junction of junction layer 28a is correspondingly textured and all regions of cell 14a follow the textured configuration. The texturing is preferable to a depth in the range of 0.2-2μ and the textured angle α is preferably in the range of 30°-70°. Any suitable procedure may be used to obtain the texturing such as by using a hydrazine etch for a c-Si substrate, or texturing by using selective ion beam milling, etc.

FIG. 3 illustrates a further embodiment of this invention to emphasize that the invention is not limited to a photovoltaic device having only two cells. As illustrated in FIG. 3, device 10B includes crystalline cell 14b and a pair of amorphous cells 16b, 16c. Any number of such additional amorphous cells may be used. Such cells decrease in energy gap as the amorphous cell is more proximate to the crystalline cell which, in turn, is of even lesser energy gap.

It is also within the spirit of this invention to provide techniques for improving the quality of a-Si films. In this respect, a-Si:H or a-Si:H,F films evolve H at high temperatures (>300° C.). Thus, films prepared at high temperatures (e.g. 400° C.) may evolve H during the cooling process from 400° to 300° C. This results in deterioration of the semiconducting properties of the of the film. The H evolution may be reduced during the cooling process by cooling the film in an H plasma. The H plasma may be produced by plasma decomposition of, for example, $SiH_4$ or $H_2$. Thus, if the original film was grown at an elevated temperature (e.g. 400° C.) at a certain power level, then during the cooling process the power should be reduced so as to slow down the growth rate. However, H plasma is still present in the system since the plasma power is still on. Hence, as the film is cooling, a very thin layer of a-Si is being deposited, and the presence of H plasma reduces H evolution from the cooling film. The power is finally switched off when the temperature drops below about 300° C. at which time the H evolution almost ceases.

It is noted throughout this application that abbreviations from the Periodic Chart are used to refer to various elements.

What is claimed is:

1. In a multiple gap photovoltaic device having an opaque electrical contact and a transparent electrical contact with a first cell and a second cell therebetween and with the first cell being adjacent the transparent electrical contact and the second cell being adjacent the opaque electrical contact, the improvement being said first cell being made from an amorphous semiconductor, and said second cell being made from a crystalline semiconductor.

2. The device of claim 1 wherein said first cell is made from amorphous silicon or its alloys, and said second cell being made from crystalline silicon or its alloys.

3. The device of claim 1 wherein said second cell has a textured surface at its physical junction with said first cell.

4. The device of claim 1 wherein the energy gap of said first cell is higher than the energy gap of said second cell.

5. The device of claim 1 including at least one further amorphous semiconductor cell between said first cell and said second cell.

6. The device of claim 5 wherein said cells are of decreasing energy gap from said first cell to said second cell.

7. The device of claim 1 wherein said second cell is substantially thicker than said first cell.

8. In a multiple gap photovoltaic device having an opaque electrical contact and a transparent electrical contact with a first cell and a second cell therebetween and with the first cell being adjacent the transparent electrical contact and the second cell being adjacent the opaque electrical contact, the improvement being said second cell having a textured surface at its physical junction with said first cell.

9. In a method of making a multiple gap photovoltaic device wherein a transparent electrical contact is formed on a first cell which is deposited on a second cell which in turn is formed on an opaque electrical contact, the improvement being forming the first cell from an amorphous semiconductor and forming the second cell from a crystalline semiconductor.

10. The method of claim 9 wherein the first cell is made from amorphous silicon or its alloys, and the second cell is made from crystalline silicon or its alloys thereof.

11. The method of claim 9 wherein the second cell is textured at its surface which makes physical contact with the first cell.

12. The method of claim 9 including forming at least one further amorphous semiconductor cell between the first cell and the second cell.

* * * * *

UNITED STATES PATENT OFFICE
CERTIFICATE OF CORRECTION

Patent No. 4,253,882  Dated March 3, 1981

Inventor(s) Vikram L. Dalal

It is certified that error appears in the above-identified patent and that said Letters Patent are hereby corrected as shown below:

Column 1, line 19, "cyrstalline" should be -- crystalline --.

Column 3, line 24, "32" should be -- = --;

line 30, "case" should be -- cases --;

line 42, "juction" should be -- junction --.

Column 4, line 36, "cel" should be -- cell --.

Column 5, line 5, "semiconducing" should be -- semiconducting --.

Signed and Sealed this

Twenty-first Day of July 1981

[SEAL]

Attest:

Attesting Officer

GERALD J. MOSSINGHOFF

Commissioner of Patents and Trademarks